(12) United States Patent
Engelmann

(10) Patent No.: US 7,142,189 B2
(45) Date of Patent: Nov. 28, 2006

(54) ARRANGEMENT FOR ILLUMINATING A SWITCH SURFACE FOR A TOUCH SENSOR SWITCH

(75) Inventor: Harry Engelmann, Ingelheim (DE)

(73) Assignee: Schott AG, Mainz (DE)

( * ) Notice: Subject to any disclaimer, the term of this patent is extended or adjusted under 35 U.S.C. 154(b) by 320 days.

(21) Appl. No.: 10/429,109

(22) Filed: May 2, 2003

(65) Prior Publication Data

US 2003/0210537 A1    Nov. 13, 2003

(30) Foreign Application Priority Data

May 7, 2002   (DE) ................. 102 20 268
Dec. 18, 2002  (DE) ................. 102 59 297

(51) Int. Cl.
*G09G 3/36* (2006.01)

(52) U.S. Cl. ........................ 345/102; 345/176

(58) Field of Classification Search ............. 345/156, 345/165, 166–170, 171–176, 102, 178, 179; 200/5 R, 159, 310, 311; 349/61–67; 178/18.01, 178/18.05, 18.06, 18.11

See application file for complete search history.

(56) References Cited

U.S. PATENT DOCUMENTS

| | | | |
|---|---|---|---|
| 5,239,152 A | 8/1993 | Caldwell et al. | |
| 5,594,222 A | 1/1997 | Caldwell | |
| 6,819,316 B1* | 11/2004 | Schulz et al. | ............... 345/174 |

| | | | |
|---|---|---|---|
| 2001/0021107 A1 | 9/2001 | Funamoto et al. | |
| 2003/0122794 A1* | 7/2003 | Caldwell | ................. 345/173 |

FOREIGN PATENT DOCUMENTS

| | | |
|---|---|---|
| DE | 29 36 815 A1 | 4/1981 |
| DE | 199 07 226 A1 | 8/2000 |
| DE | 100 12 264 A1 | 10/2000 |
| DE | 42 27 468 C2 | 1/2002 |
| DE | 101 01 893 C1 | 7/2002 |
| EP | 0 859 467 A1 | 8/1998 |

OTHER PUBLICATIONS

Blumenfeld, A., et al: "Parts That Glow", In Machine Design, Oct. 1959, pp. 94-103.

* cited by examiner

*Primary Examiner*—Nitin Patel
(74) *Attorney, Agent, or Firm*—Michael J. Striker

(57) ABSTRACT

The arrangement for illuminating at least one switch surface (3) provided on a transparent panel (1) has at least one light source (9) and a touch sensor switch (5) arranged behind the at least one switch surface (3). The illumination should not interfere with the switching function and a touch sensor switch (5) does not need its own light source (9). The light source (9) is spaced from the at least one switch surface (3) so that the at least one light source (9) radiates light into the transparent panel (1) or into an optical waveguide (15, 16, 17, 19, 20) arranged on the transparent panel (1). The light of the at least one light source (9) is guided into the transparent panel or the optical waveguide toward the at least one switch surface (3) and conducted into a region between the at least one switch surface (3) and a sensor element (7) of the touch sensor switch (5).

6 Claims, 10 Drawing Sheets

ARRANGEMENT FOR ILLUMINATING A SWITCH SURFACE FOR A TOUCH SENSOR SWITCH

BACKGROUND OF THE INVENTION

1. Field of the Invention

The present invention relates to an arrangement for illuminating at least one switch surface provided on a transparent panel with a light source, which has a touch sensor switch arranged behind the at least one switch surface.

2. Description of the Related Art

Operator panels of apparatuses, for example baking ovens or cooking units, are formed by transparent panels according to the state of the art, especially of plastic, glass or glass ceramic. Switch surfaces are provided on the panels for manually switching operating functions of the apparatuses. A touch sensor switch is arranged on the rear side of the operator panel facing away from the switching surface for each switching surface. The touch sensor switch has a sensor, which reacts to contact with a finger on the switch surface, for example optically, capacitively or generally by influencing an electric field.

A touch sensor switch arranged on a glass ceramic panel is described in DE 199 07 226 A1. It has a sensor element with a sensor surface and an illuminated indicator. The sensor surface is provided with an outlet corresponding in shape to the lighting means and encompasses the lighting means. Each switching surface and/or each touch sensor switch is provided with its own lighting source. The light source is part of the touch sensor switch. The touch sensor switch is thus expensive.

A touch sensor switch equipped with a sensor element or button is described in EP 0 859 467. The sensor element or button has a flexible body, in which a light-emitting diode is inserted as an illuminating or lighting means. Each touch sensor switch is provided with its own lighting means.

In U.S. Pat. No. 5,239,152 a capacitive touch sensor switch is described, behind which a light source illuminating it is arranged. An additional capacitive touch sensor switch is described in U.S. Pat. No. 5,594,222.

SUMMARY OF THE INVENTION

It is an object of the present invention to provide an arrangement for illuminating a switch surface of the above-described kind, which does not interfere with the switching operation of an associated touch sensor switch and which makes the need for a touch sensor switch containing its own illumination device superfluous.

This object and others which will be made more apparent hereinafter are attained in an arrangement for illuminating at least one switch surface provided on a transparent panel, especially a plastic, glass or glass ceramic panel, with a light source and a touch sensor switch arranged behind the at least one switch surface.

In the arrangement according to the invention the light source is spaced from the switch surface so that the light source radiates light into the transparent panel or into an optical waveguide arranged on it, its light is guided in the transparent panel or the optical waveguide toward the switch surface and its light is conducted in a region between the switch surface and a sensor element of the touch sensor switch.

The arrangement for illuminating according to the invention attains the object of the invention because the touch sensor switch and the light source are spatially separated from each other. For that reason they do not interfere with the functioning of each other.

In the arrangement for illuminating according to the invention different economical commercially available touch sensor switches without their own internal lighting device can be used, because the light from the light source is conducted through the panel or the light guide or optical waveguide. The light from the illuminating device need not pass through the touch sensor switch. The switching operation is independent from the illumination operation.

In preferred embodiments one light source is sufficient for several switch surfaces. Each switch surface to be illuminated thus does not need to provided with its own light source.

Since the illumination is shifted to the panel or the optical waveguide, a flat structure is possible. The scatter zones require no additional space.

Different illumination or lighting effects may be attained by selection of the form of the scatter zones and/or the color of the scatter zones and/or the color of the light source in the described arrangement. The scatter zones may be formed so that the user can see them with a sufficiently transparent panel, also with light falling on the panel (incident light), when the light source is switched off. For that reason the position of the switch surface is always observable for the operator or user.

The illumination can have different functions. It can be a night visible pattern or an ornamental illumination. It can serve for marking the position of the switch surface and/or for announcing a performed switch process and/or for signaling a switch state. It can be in the form of illuminated symbols for the functions of the switch surface.

The described illumination device can be used in a baking oven, a cooking oven or a range or other units and apparatuses that include operator fields, such as vending machines and elevators. It can always be used, when the operator field has a transparent panel, for example made from glass, glass ceramic or plastic. In all cases the spatial separation of the light source from the touch sensor switch prevents them from interfering with their respective functions. The light is prepared in the panel forming the operator panel and/or operator field or in the light guide. It is not limited in any way by the type and structure of the touch sensor switch. The type and structure of the touch sensor switch can be freely selected to optimize its functions. The type of the light source can be selected independently from the touch sensor switch. It has no effect or influence on the structure and function of the touch sensor switch. For that reason color effects and/or intensity effects can be provided in the arrangement for illumination according to the invention.

BRIEF DESCRIPTION OF THE SEVERAL VIEWS OF THE DRAWING

The objects, features and advantages of the invention will now be illustrated in more detail with the aid of the following description of the preferred embodiments, with reference to the accompanying figures in which:

FIG. 9 is a plan view of an adhesive strip or film of the embodiment shown in FIG. 7 with a cavity or opening for the light source;

DESCRIPTION OF THE PREFERRED EMBODIMENTS

Figure 1:
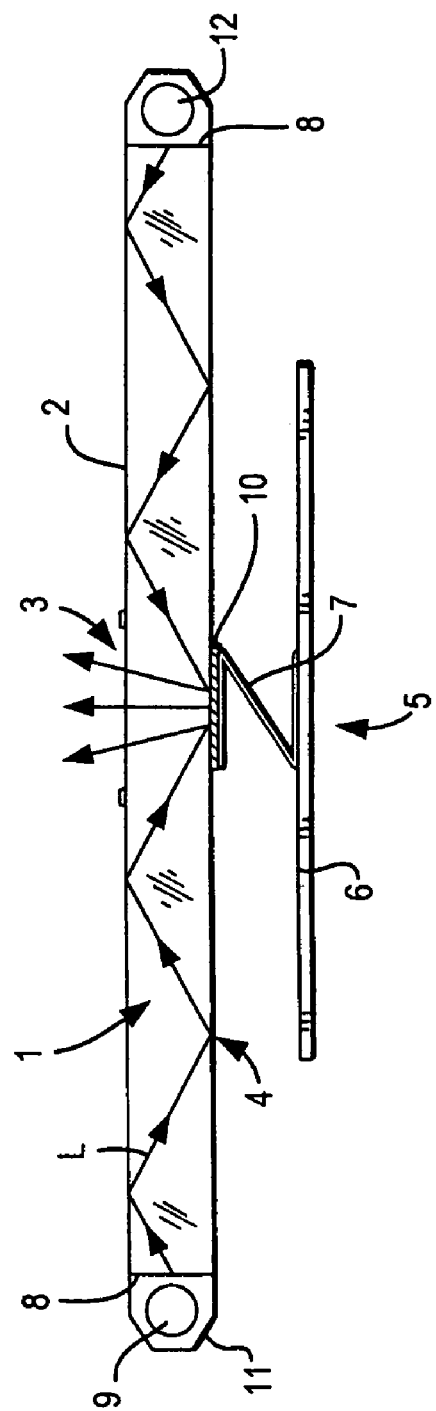
FIG. 1 is a cross-sectional view of a first embodiment of an arrangement according to the invention including an operator panel with light sources arranged at the its ends and a scatter zone formed on the rear of the operator panel, in which only one touch sensor switch is shown.
Figure 2:
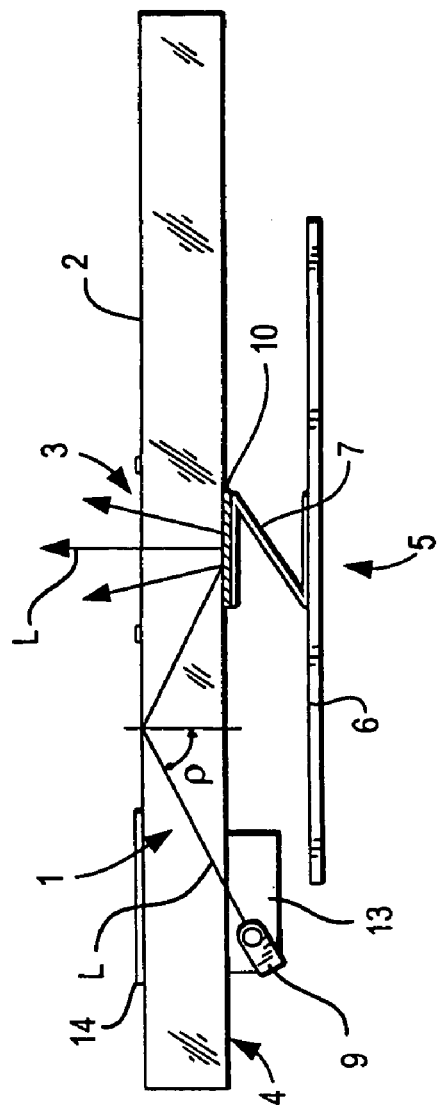
FIG. 2 is a cross-sectional view of a second embodiment of an arrangement according to the invention including an operator panel with a light source arranged behind the operator panel.
Figure 3:
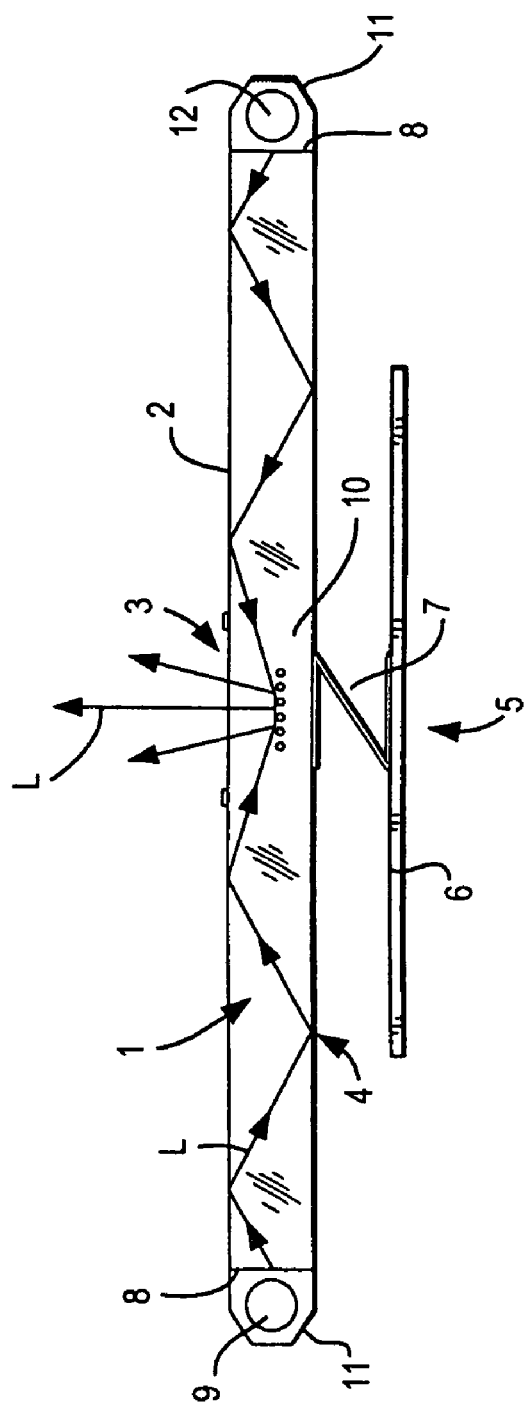
FIG. 3 is a cross-sectional view of a third embodiment of an arrangement according to the invention in which the scatter zone is formed inside of the operator panel.

An operator panel for switching electrical functions of an apparatus has a transparent panel 1, for example a glass ceramic panel. This panel 1 can also provided a cooking surface on which cooking vessels are placed at the same time. On the front side 2 of the panel 1 fingertip sized switch surfaces 3 are provided, of which only one is shown in FIGS. 1, 2 and 3.

A respective touch sensor switch 5 is arranged on the rear side 4 of the panel 1 facing away from the front side 2 opposite from each switch surface 3. In a known manner it comprises a sensor element 7 arranged on a circuit board 6. The touch sensor switch 5 is activated by a finger touch on the switch surface 3, whereby it switches the concerned operating function of the unit or apparatus on or off.

A light source 9 spaced from the switch surface 3 is arranged on the lateral edges of the panel 1 (see FIGS. 1, 3) to illuminate the switch surface 3 or several switch surfaces. In the vicinity of each switch surface 3 a scatter zone 10 is formed on the rear side 4 of the panel 1 (see FIGS. 1,2) or inside the panel 1 (see FIG. 3).

The light L of the light source 9 is coupled in the panel at the edge 8 of the panel 1. It propagates in the panel 1 with multiple total reflections on the front side 2 and the rear side 4, so that light or most of the light does not miss the switch surface 3. The light guided in the panel 1 by total reflections impinges on the scatter zone 10 and is scattered by it. The scattered light thus leaves the panel 1 through the switch surface 3 so that the switch surface appears to be bright in comparison to the surrounding surface on the panel 1.

In order to minimize reflection losses at the edge 8, the light of the light source 9 is conducted to the edge 8 in as large as possible an obtuse angle. In order to propagate the light of the light source 9 largely in the panel 1 as much as possible, a reflective surface or mirroring 11 can be provided on side of the light source that faces away from the edge 8.

In the embodiments shown in FIGS. 1 and 3 a second light source 12 is provided on the panel 1. This second light source radiates light into the panel 1 like the first light source 9. It can have a different color or intensity than the first light source 9. Furthermore it can be turned on and off separately from the light source 9, for example depending on the operation of the touch sensor switch 5.

The scatter zone 10 formed on the rear side 4 of the panel 1 according to FIGS. 1 and 2 can be formed by an engraving or a frosting of the rear side 4 or a single or multicolor printing of the rear side 4. The scatter zone 10 can have the form of patterns or symbols, for example digits, letters or other symbols designating the functions to be switched by means of the concerned switching surface.

In the embodiment according to FIG. 2 the light source 9 is laterally spaced from the switching surface 3 on the rear side 4 of the panel 1. The impingement angle of the light L is selected so that the light is totally reflected within the panel 1. So that total reflection does not occur already when the light is coupled into the panel 1, the light source 9 can be optically coupled to the panel 1 by means of a medium 13. The medium 13 has an index of refraction that is the same or similar to that of the panel 1. For example if an LED is used as the light source 9, it can be glued to the rear side 4 with the help of an epoxy resin adhesive. Further possibilities for coupling the light from the rear side 4 of the panel 1 under a sufficiently large angle into the panel 1 include use of optical devices, such as diffusers, optical gratings, prisms and mirrors.

A coating 14 may be applied to the front side 2 so that the light source 9 in FIG. 2 is invisible to the user.

The scatter zone 10 is formed within the panel 1 in the embodiment shown in FIG. 3. This interior scatter zone 10 may be made by means of a known process. Interruptions or defects are produced in the material of the panel 1 with the help of a laser in this process in order to form the scatter zone 10. This process permits three-dimensional symbols to be produced, which form the scatter zone, when the panel 1 has sufficient wall thickness.

Figure 4:
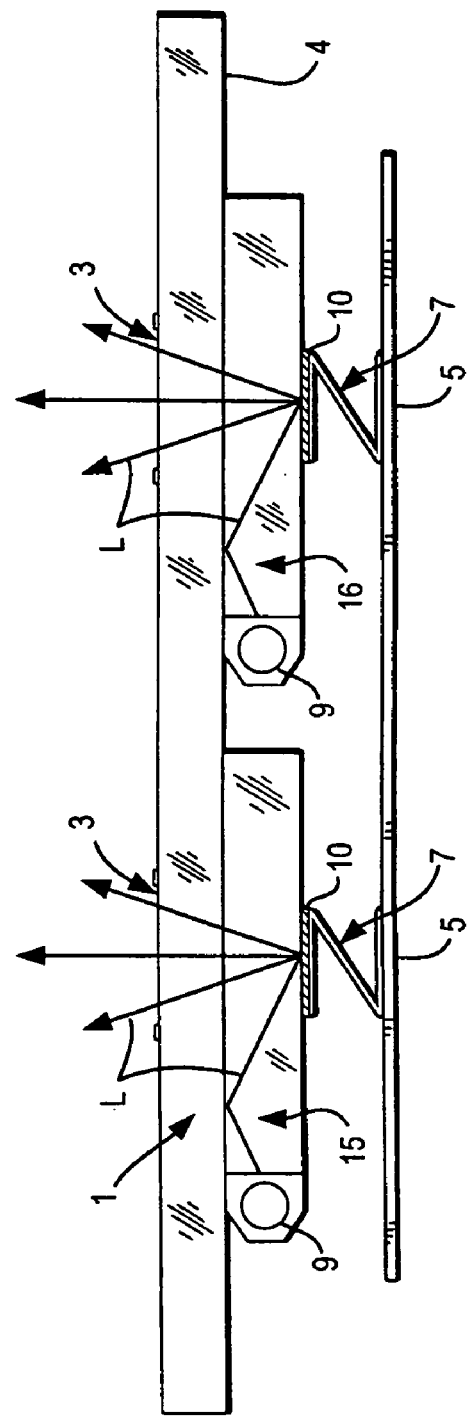
FIG. 4 is a cross-sectional view of a fourth embodiment of an arrangement according to the invention in which an optical waveguide is arranged on the operator panel.

In the embodiment according to FIG. 4 several separate optical waveguides 15,16 are arranged between the rear side 4 of the panel 1 and the sensor element 7 of the touch sensor switch 5, which are associated with the respective switch surfaces 3 or a group of them. The optical waveguides 15,16 are illuminated by one or more light sources 9 at their edges, spaced laterally from the switch surfaces 3. The scatter zones 10 are, as described above, formed at or in the optical waveguides 15,16 so that light guided into the respective optical waveguides 15,16 propagates through the associated switch surfaces 3. Because of that they may be illuminated differently in regard to color and/or brightness. The optical waveguides 15,16 could also be illuminated by a single central light source. Its light would be guided by the optical fibers made from glass or plastic to the light guides 15 and 16.

Various illumination effects are attainable by the above-described devices. A uniform illumination of the switch surfaces 3 or symbols appearing on the switch surfaces 3 can be achieved. The color of the illumination may vary by selection of the color of the light radiated from the light source 9 and by selection of the color of the panel 1 or by selection of the color of the scatter zone 10. This permits different color effects to be produced. For example, the switch surface 3 can be illuminated green when the touch sensor switch 5 is turned off and red when it is turned on, so that the operator can know the state of the touch sensor switch 5. When the switching process causes a stepwise change, for example of the power supplied to an element, for example a cooking zone of a range, the brightness of the light source 9 can be varied according to the applied power, so that the operator can be aware of that change. The switch surface 3 can also be illuminated by two or more differently colored light sources 9, whose brightness ratio depends on the applied power. Thus a continuously changing mixture of colors can be used to indicate or signal a continuous transition from an "off state" to a state with maximum applied power.

If color printing is used to form the scatter zone 10, which can be a symbol or a surface, similar color effects can be obtained. Thus, when the panel 1 is clear the light source 9 radiates white light, the switch surface 3 appears illuminated according to the color used. If a light source 9 radiating colored light is used, a number of color effects may be produced in connection with differently colored printing. If the color printing for the scatter zone 10 that includes a combination, for example, of a yellow background with blue symbols, these colors are observable during illumination with white light. When illuminated with blue light however the blue color appears more intense, while the yellow printed region appears white. If the light source 9 radiates red light, the blue printed region appears largely dark, while in contrast the yellow printed region appears orange.

Figure 5:
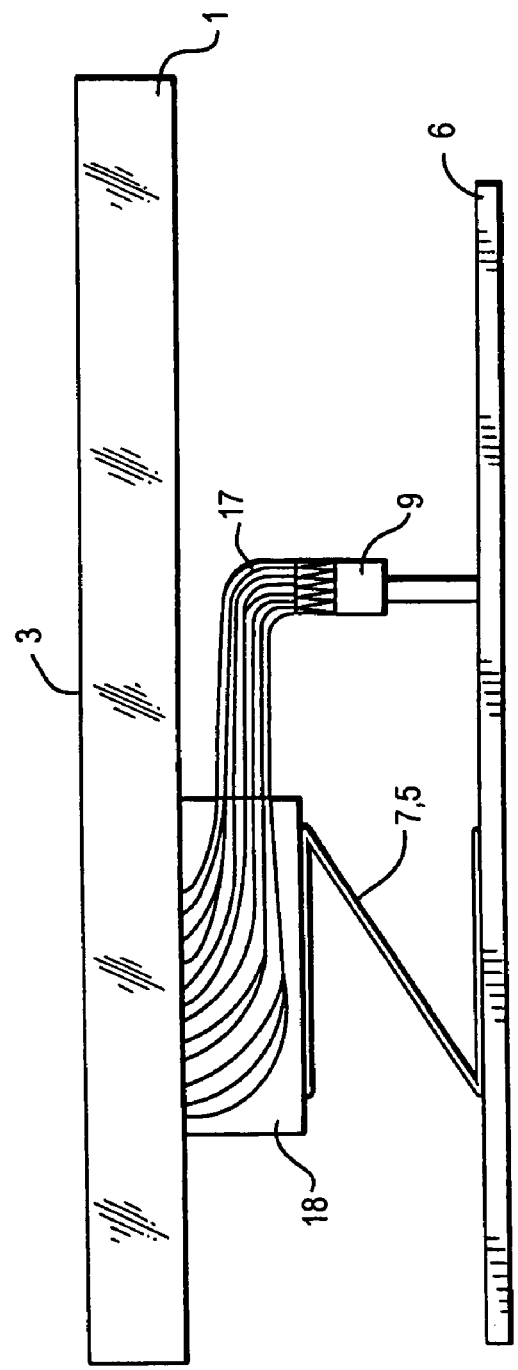
FIG. 5 is a cross-sectional view of a fifth embodiment of an arrangement according to the invention in which optical fibers are arranged between the light source and the operator panel.

A circuit board 6, which carries the electrical circuit for the touch sensor switch 5, can mechanically support and electrically connect the light source 9, especially a light emitting diode, Also in the embodiment according to FIG. 5 the light source 9 is mounted on the circuit board 6 beside the touch sensor switch 5. The light of the light source 9 is guided by means of a bundle of optical fibers to the switch surface 3. The end of the optical fibers at the panel 1 are cast in a block 18, for example made of plastic or wax, in order to provide uniform spreading out of the illumination over the switch surface 3. The block 18 is arranged above the sensor element 7 of the touch sensor switch 5 and rests on it. A special scatter zone is not provided.

Figure 6:
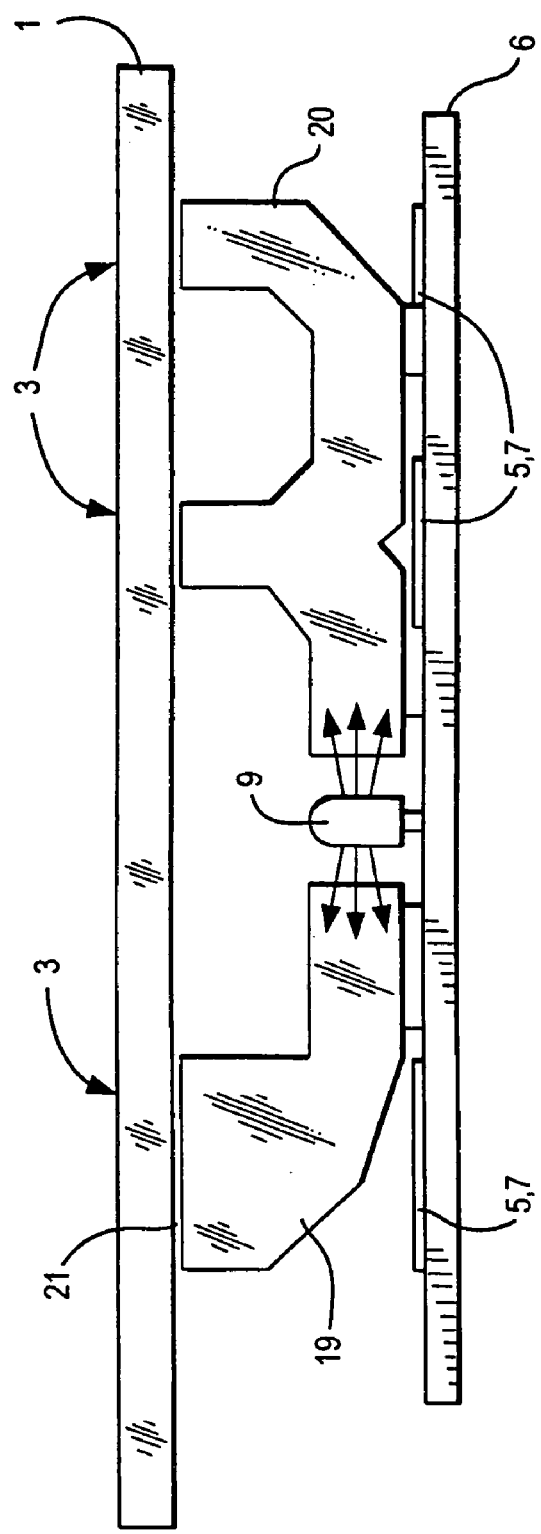
FIG. 6 is a cross-sectional view of a sixth embodiment according to the invention in which a light guiding body is arranged between the light source and the operator panel.

The special scatter zone is also not part of the embodiment shown in FIG. 6. Two three-dimensional shaped light guide bodies 19, 20 are shown, which guide the light through their bulk from the light source 9 to the switch surfaces above the touch sensor switches 5. The touch sensor switch 5 in this embodiment activates by influencing an electric field occurring due to contact of a finger. The light guide bodies 19, 20 lie on the sensor element 7 of the respective touch sensor switch 5. Signs or marks symbolizing the functions of the respective touch sensor switch 5 can be arranged on those surfaces 21 of the light guide bodies 19, 20, to which the light for the respective switch surfaces 3 is output. These signs or marks shade or block the light so as to make the sign or mark visible to the operator. Alternatively the light guide body 19 and/or 20 can have the form of a suitable symbol at the place where the light leaves it and enters the panel 1.

FIGS. 7 to 11 show a simple and economically made and mounted structure for this arrangement. The light waveguide 15 can be formed by a transparent adhesive strip of suitable thickness. The light of the light source 9 is coupled into this adhesive strip and coupled out of the switch surface 3, which is bounded by a marking 22. The adhesive strip can be made as a measured good or as a prefabricated punched part. The thickness of this adhesive strip is, for example, from 0.5 mm to 5 mm, especially from 1 mm to 2 mm.

Figure 8A:
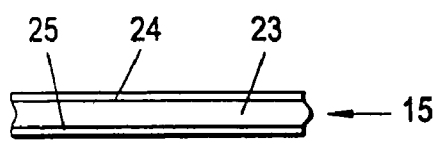
FIGS. 8a, 8b, 8c and 8d are respective diagrammatic cross-sectional views of modifications of the optical waveguide of FIG. 7, in which an adhesive strip that is adherent on both sides, an adhesive film that is adherent on both sides, an adhesive strip that is adherent on one side and an adhesive film that is adherent on one side are shown.
Figure 8B:
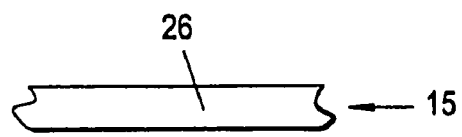
Figure 8C:
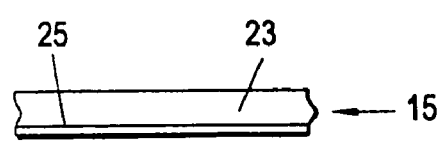

According to FIGS. 8a and 8c the adhesive strip has a transparent support 23, which has a transparent adhesive film 24, 25 on both sides (FIG. 8a) or one side (FIG. 8c).

Figure 8D:
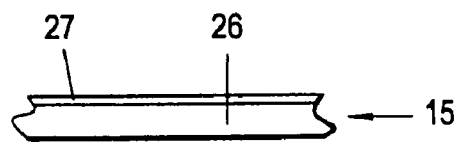
Figure 8D:
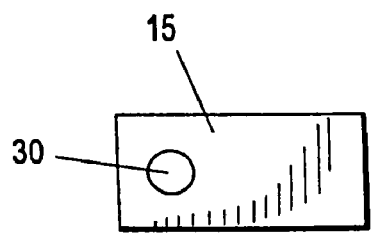

According to FIGS. 8b and 8d the adhesive strip is formed by a light transmitting adhesive film 26. An acrylate adhesive strip, such as SCOTCH® VHB product of 3M, can be used as the light-transmitting adhesive film. An adhesive strip obtained under the trademark SCOTCH® Isotac can also be used as the adhesive film. This material is characterized by a high transparency and age and heat resistance with good adherence properties. It is obtained in various thickness as metered goods or as a punched part. It can be laminated to be adherent on both sides or on one side.

An adhesive strip, which is adherent on one side, may be glued to the circuit board 6 or the panel 1, which is the operator panel, during assembly. The adhesive strip, which is adherent on both sides, can be used to glue the circuit board 6 to the panel 1. Respective adhesive films 24, 25 may be provided on both sides of a transparent support 23 to provide the adhesive strip which is adherent on both sides (see FIG. 8a). The adhesive film 26 is adherent without more on both sides (see FIG. 8b). For an adhesive strip that is adherent on only one side the support 23 is provided with an adhesive film 25 on only one side (see FIG. 8c). The adhesive film 26 is provided with a non-adherent transparent cover foil 27 on its other side when only one side is to be adherent (see FIG. 8d). FIGS. 8c and 8d show the embodiments in which the adhesive strip should be glued to the circuit board 6.

In order to avoid affecting the light color observed on the switch surface 3 because of the color of the usually green circuit board 6, the circuit board 6 can be white colored or have any other color in the vicinity of the light waveguides 15 and/or 16. This can occur, for example, by printing the circuit board 6 or by gluing an additional white or colored adhesive strip as an intermediate layer between the circuit board 6 and the adhesive strip acting as a light guide. In the embodiments shown in FIGS. 8a and 8c the adhesive film 25 can be white or colored or at least non-transparent instead of providing an additional white or colored adhesive strip. This layer can function as a scattering zone.

Figure 7:
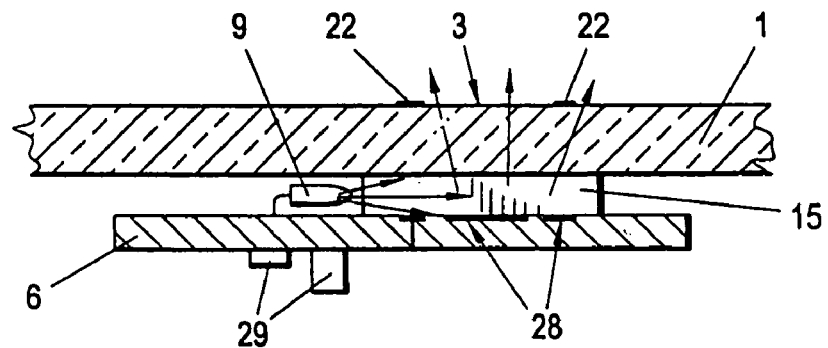
FIG. 7 is a cross-sectional view of another embodiment with an optical waveguide formed from an adhesive strip or an adhesive film.
Figure 10:
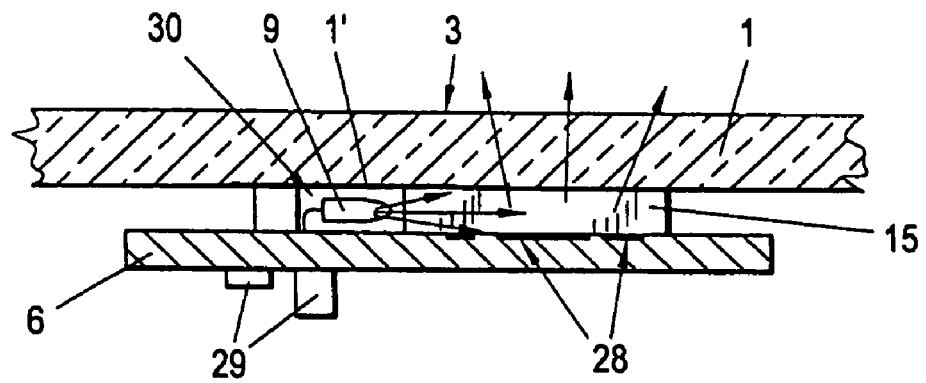
FIG. 10 is a cross-sectional view of another arrangement according to the invention in which a light source is arranged in the cavity or opening in the adhesive strip or film shown in FIG. 9.
Figure 11:
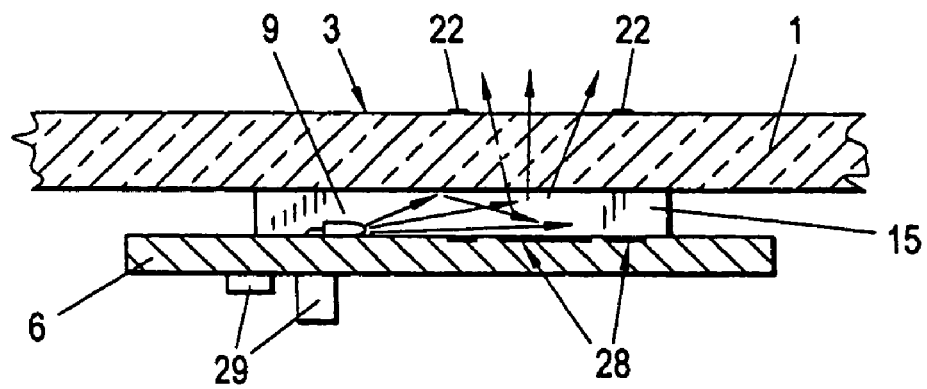
FIG. 11 is a cross-sectional view of an additional embodiment according to the invention in which the adhesive strip is glued over the light source.

FIGS. 7, 10 and 11 show an arrangement with an electrode 28 serving as sensor element 7, a light emitting diode serving as light source 9 and an electronic component 29 required for the touch sensor switch 5 on the circuit board 6.

In the embodiment shown in FIG. 7 the light source 9 is arranged laterally beside the adhesive strip serving as the optical waveguide 15. In the embodiment according to FIGS. 9 and 10 the transparent adhesive strip has an opening or cavity 30, in which the light source 9 extends. In the embodiment according to FIG. 11 the light source 9—especially formed flat structured, laterally radiating as in SMD (surface mounting device) technology—is covered with the transparent adhesive strip acting as the light waveguide 15. The adhesive strip is preferably soft and sufficiently thick for that purpose.

In order to make the light source 9 invisible to the user, an additional printing 1' can be provided over the light source 9 on the rear side 4 of the panel 1 (see FIG. 10).

To improve the light scatter in the vicinity of the switch surface 3 it is possible to use an adhesive strip, in which scattering centers, for example in the form of small glass balls, are integrated. In this way additional scattering zones can be eliminated, i.e. are not needed.

Numerous further embodiments are also possible using the above-described features. The panel 1 or the circuit board 6 can be formed as a light guide with an optically sealed or tight core. The light source 9 can also be arranged behind the touch sensor switch 5. The light waveguide 15,16 or the bundle 17 of optical fibers or the light guide body 19,20 are then formed so that they guide light around the touch sensor switch 5 to the switch surface 3.

Figure 12:
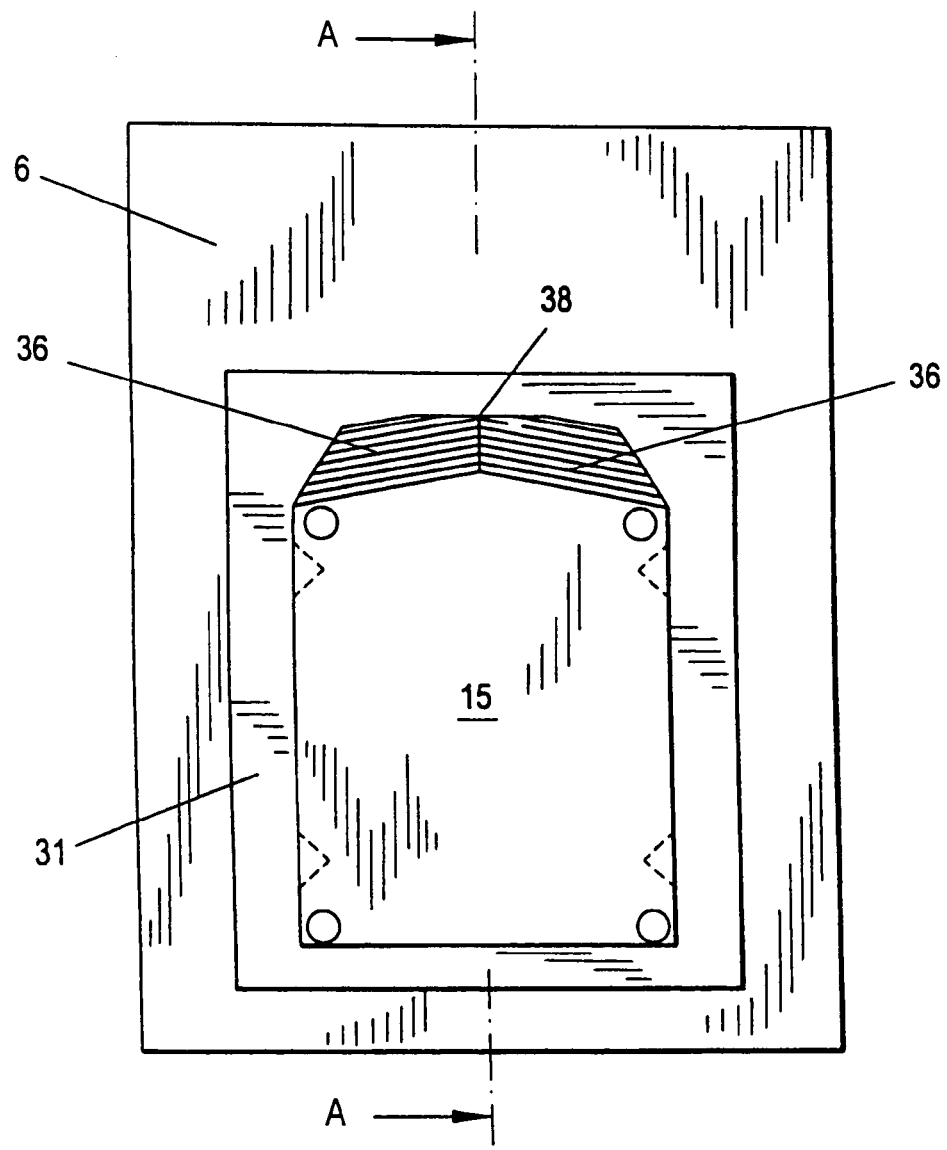
FIG. 12 is a plan view of a further embodiment of the arrangement according to the invention.
Figure 13:
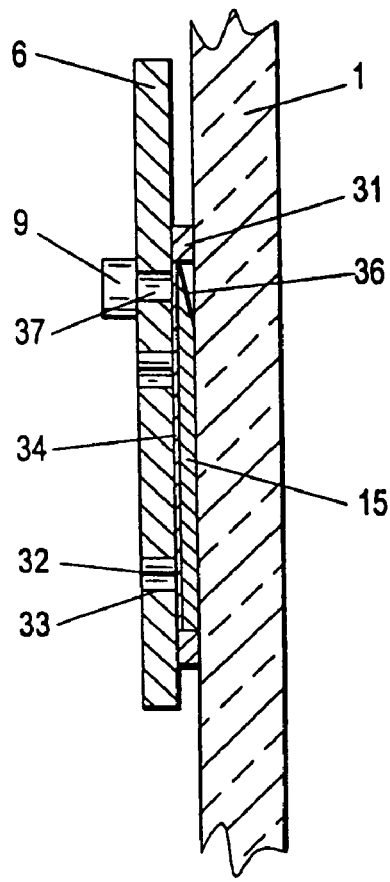
FIG. 13 is a cross-sectional view of the embodiment shown in FIG. 12 taken along the section line A—A in FIG. 12.
Figure 14:
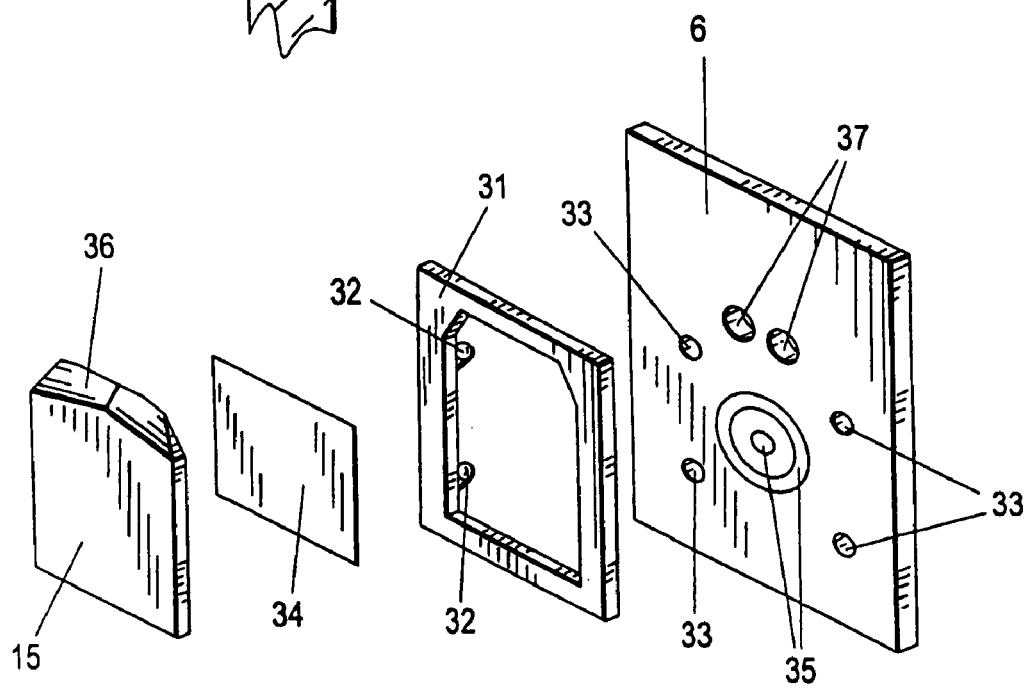
FIG. 14 is an exploded perspective view of yet another embodiment of the arrangement according to the invention for illuminating at least one switch surface with at least one light source.

In the embodiment according to FIGS. 12 to 14 the plate-shaped light guide 15 is snapped into a frame 31. The frame 31 has tapered pins 32, which engage tightly in a press fit in openings 33 provided in the circuit board 6.

An electrically non-conducting, for example white or silver, reflector foil 34 is arranged between the light guide 15 and the circuit board 6. It covers the electrodes 35 of the sensor element 7 arranged on the circuit board 6 and the circuit board 6 and scatters light in the direction of the switch surface 3.

The light guide 15 has a serrated or smooth beveled edge 36, which can be covered by a portion of the frame 31. The circuit board 6 is provided with at least one through-going opening or passage 37 at the beveled edge 36, in which the light source 9, for example a light emitting diode, rests, or through which it radiates into the optical waveguide 15. The beveled edge 36 guides the light of the light source into the light waveguide 15. The light source 9 is not visible to the used because of the covering provided by the beveled edge 36.

When two or more light sources are provided, then different color mixture effects can be provided when the light sources are of different colors.

The light waveguide 15 can extend over one or more switch surfaces. If it extends over several switch surfaces, then they can be bounded by printing or other coatings of the light waveguide 15 or the panel 1, which are detectable optically by the user.

The beveled edge 36 has a kink 38, which improves the light distribution in the light guide 15 in the embodiment according to FIGS. 12 to 14 provided with two spaced apart light sources 9.

The frame 31 can be formed light reflecting so that it reflects light from the light waveguide 15 back into it. Accordingly the edge of the light waveguide 15 made from plastic or glass can be coated or formed so that it is light reflecting.

In the various embodiments the light sources 9 and the sensor element 7 of the touch sensor switch 5 are separated from each other, so that they do not influence each other in operation. The zones of the light guides or optical waveguides 15, 16, 17, 19, 20 can be formed as symbols or carry symbols, which characterize the functions of the associated touch sensor switch 5.

The disclosures of German Patent Applications 102 59 297.7 of Dec. 18, 2002 and 102 20 268.0-33 of May 7, 2002 are incorporated here by reference. These German Patent Applications provide the basis for a claim of priority for the instant invention under 35 U.S.C. 119.

While the invention has been illustrated and described as embodied in a lighting device for a switching surface, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

I claim:

1. An arrangement for illuminating at least one switch surface (3) provided on a transparent panel (1), said arrangement comprising at least one light source (9) and a touch sensor switch (5) arranged behind the at least one switch surface (3), wherein the at least one light source (9) is positioned and spaced from the at least one switch surface (3) so that the at least one light source (9) radiates light into the transparent panel (1) or into a light waveguide (15, 16, 17, 19, 20) arranged on the transparent panel (1), said light of the at least one light source (9) guided into the transparent panel or the optical waveguide is guided toward the at least one switch surface (3) and conducted into a region between the at least one switch surface (3) and a sensor element (7) of the touch sensor switch (5), wherein said light waveguide comprises a transparent adhesive strip, which is glued on at least one of the panel (1) and a circuit board (6) carrying the at least one light source (9) so that light of the at least one light source 99) is coupled into said transparent adhesive strip, a plurality of optical fibers and wherein light from a common lighting device is guided to the light waveguide by means of said optical fibers.

2. The arrangement as defined in claim 1, further comprising a plurality of optical fibers and wherein tight from a common lighting device is guided to the light waveguide by means of said optical fibers.

3. The arrangement as defined in claim 1, wherein the transparent panel (1) is composed of plastic, glass or glass ceramic material.

4. An arrangement for illuminating at least one switch surface (3) provided on a transparent panel (1), said arrangement comprising at least one light source (9) and a touch sensor switch (5) arranged behind the at least one switch surface (3), wherein the at least one light source (9) is positioned and spaced from the at least one switch surface (3) so that the at least one light source (9) radiates light into the transparent panel (1) or into a light waveguide (15, 16, 17, 19, 20) arranged on the transparent panel (1), said light of the at least one light source (9) guided into the transparent panel or the optical waveguide is guided toward the at least one switch surface (3) and conducted into a region between the at least one switch surface (3) and a sensor element (7) of the touch sensor switch (5), wherein said at least one light source (9) comprises a plurality of lighting devices and said lighting devices provide at least one of different colored light and different intensity light or said at least one light source consists of a single lighting device having at least one of a variable color and variable intensity, wherein said transparent adhesive strip comprises a transparent supporting strip (23) and an adhesive film (24, 25) adhering on at least one side of the supporting strip or said transparent adhesive strip comprises a light-transmitting adhesive film (26).

5. The arrangement as defined in claim 4, wherein said adhesive film is provided with non-adhesive covering foil (27) on one side thereof.

6. The arrangement as defined in claim 4, wherein said adhesive strip is provided with a cavity (30) in which said at least one light source (9) extends or is glued over said at least one light source (9).

* * * * *